(12) United States Patent
Amemiya et al.

(10) Patent No.: US 12,130,347 B2
(45) Date of Patent: Oct. 29, 2024

(54) MAGNETIC RESONANCE IMAGING APPARATUS, IMAGE PROCESSING APPARATUS, AND IMAGE PROCESSING METHOD

(71) Applicant: FUJIFILM Healthcare Corporation, Kashiwa (JP)

(72) Inventors: Tomoki Amemiya, Chiba (JP); Toru Shirai, Chiba (JP); Atsuro Suzuki, Chiba (JP); Yukio Kaneko, Chiba (JP); Hiroki Shoji, Chiba (JP); Keisuke Nishio, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 57 days.

(21) Appl. No.: 17/969,884

(22) Filed: Oct. 20, 2022

(65) Prior Publication Data

US 2023/0142011 A1 May 11, 2023

(30) Foreign Application Priority Data

Nov. 8, 2021 (JP) ................. 2021-182079

(51) Int. Cl.
*G01R 33/56* (2006.01)
*G01R 33/561* (2006.01)
*G06T 11/00* (2006.01)

(52) U.S. Cl.
CPC ...... *G01R 33/5608* (2013.01); *G01R 33/5611* (2013.01); *G06T 11/008* (2013.01); *G06T 2211/424* (2013.01)

(58) Field of Classification Search
CPC ............ G01R 33/5608; G01R 33/5611; G01R 33/561; G06T 11/008; G06T 2211/424; G06N 3/0464; G06N 3/09; G06N 3/08; A61B 5/055; A61B 5/0033
See application file for complete search history.

(56) References Cited

U.S. PATENT DOCUMENTS 10,712,416 B1  7/2020  Sandino et al.
2019/0004133 A1  1/2019  Li et al.
(Continued)

OTHER PUBLICATIONS

European search report dated Mar. 16, 2023 in European Patent Application No. 22206010.5.
(Continued)

*Primary Examiner* — Rishi R Patel
(74) *Attorney, Agent, or Firm* — Paul Teng

(57) ABSTRACT

Provided is a method for performing reconstruction and noise removal with high accuracy on various undersampling patterns including equidistant undersampling. An image processing unit that processes measurement data acquired by an MRI apparatus performs image reconstruction by using measurement data on respective channels measured in a predetermined undersampling pattern and sensitivity distributions of respective reception coils. At this time, denoising of a reconstructed image and a calculation for maintaining consistency between original measurement data and the measurement data on the respective channels created from denoised images are sequentially processed. Accordingly, image restoration and denoising with high accuracy are possible without depending on the undersampling pattern.

18 Claims, 14 Drawing Sheets

(56) References Cited

U.S. PATENT DOCUMENTS

2019/0257905 A1    8/2019    Cheng et al.
2022/0180574 A1*  6/2022    Mailhe ............... G01R 33/5608

OTHER PUBLICATIONS

Shah Jawad et al., "Compressively Sampled MR Image Reconstruction Using Hyperbolic Tangent-Based Soft-Thresholding", Appl Maga Reson, 46:837-851 (2015).

Jo Schlemper et al., "Data Consistency Networks for (Calibrationless) Accelerated Parallel MR Image Reconstruction", Proc Int Soc Magn Reson Med 4663 (2019).

Samsonov, A., et al., "POCSENSE: POCS-based reconstruction for sensitivity encoded magnetic resonance imaging", Magnetic Resonance in Medicine, Dec. 2004, 52(6) pp. 1397-1406.

Lustig, M., et al., "SPIRiT: Iterative Self-consistent Parallel Imaging Reconstruction from Arbitrary k-Space", Magnetic Resonance in Medicine, Aug. 2010, 64(2) pp. 451-471.

* cited by examiner

MAGNETIC RESONANCE IMAGING APPARATUS, IMAGE PROCESSING APPARATUS, AND IMAGE PROCESSING METHOD

BACKGROUND OF THE INVENTION

1. Field of the Invention

The present invention relates to a magnetic resonance imaging (MRI) apparatus, and more particularly to a technique for reconstruction and noise removal of undersampled measurement data obtained by a data reduction measurement.

2. Description of the Related Art

As a method for shortening an imaging time in MRI examination, there is a method (k-space undersampling reconstruction method) of under-sampling and acquiring signals in a spatial frequency domain (k-space), and restoring an unmeasured part by signal processing. Particularly widely used is a parallel imaging (PI) method of simultaneously receiving signals with a plurality of reception coils (channels) and restoring the same by using a difference in sensitivity distributions.

Known data restoration methods for PI include SENSE for restoring equidistant undersampled data, and also POCSENSE, SPIRIT, and the like supporting any undersampling pattern by repeated reconstruction (for example, "POCSENSE: POCS-based reconstruction for sensitivity encoded magnetic resonance imaging", Magnetic Resonance in Medicine, 2004 December, 52 (6) PP. 1397-1406 and "SPIRIT: Iterative Self-consistent Parallel Imaging Reconstruction from Arbitrary k-Space", Magnetic Resonance in Medicine, 2010 August, 64 (2) PP. 451-471). In POCSENSE or SPIRIT, a full-sampled image is restored by performing an iterative calculation to solve an inverse problem representing a relationship between measurement data, a sensitivity map, and a reconstructed image. However, in general, PI has a problem that increasing a reduction factor (undersampling rate) reduces the imaging time but increases noise.

Also, various methods for using a convolutional neural network (CNN) have been proposed to reduce noise increase due to data-reduction. For example, U.S. Pat. No. 10,712,416 proposes a reconstruction method using a learned deep layer NN in which a CNN that performs noise removal and a layer (DC layer) that performs processing for enforcing consistency between denoised data and acquired data are combined.

SUMMARY OF THE INVENTION

In general, in reconstruction using machine learning, an entire network including repeated processing is learned by sets of under-sampled images and full-sampled images.

However, there are various patterns of data-reduction (under-sampling), such as an equidistant pattern or a random pattern. In an undersampling pattern that is not included in learning data, accuracy of the reconstruction decreases, and artifacts and noise remain. It is conceivable to increase the learning data, which, however, can hardly support countless patterns, and may complicate a structure of a supporting CNN and increase a calculation time.

The invention has been made in view of the above circumstances, and an object of the invention is to provide a method for performing reconstruction and noise removal with high accuracy on various undersampling patterns including equidistant data-reduction.

In order to solve the above problem, the invention adds noise removal to a repeated calculation for maintaining consistency with measurement data. The noise removal is based on statistical properties of an image and noise.

That is, according to a first aspect of the invention, an MRI apparatus includes, for example: a measurement unit including a plurality of reception coils and configured to collect a nuclear magnetic resonance signal of a subject for each of the reception coils; a control unit configured to control an acquisition pattern for the nuclear magnetic resonance signal; and an image processing unit configured to create an image of the subject by using measurement data including the nuclear magnetic resonance signal collected for each of the reception coils. The image processing unit includes an iterative reconstruction unit configured to reconstruct an image by a repeated calculation using the measurement data for each of the reception coils.

The iterative reconstruction unit includes: an initial value setting unit configured to set an initial value for the repeated calculation based on the measurement data for each of the reception coils; a synthesis unit configured to synthesize an image for each of the reception coils; a noise removal unit configured to remove noise included in an image before or after the synthesis based on statistical properties of the image and the noise; and a data consistency maintenance unit configured to create denoised k-space data for each of the reception coils by using a denoised image and to create estimated measurement data by integrating the denoised k-space data and the measurement data. The iterative reconstruction unit is configured to perform iterative processing while updating the initial value based on the estimated measurement data.

Typically, the measurement data is measurement data under-sampled in a predetermined undersampling pattern, the iterative reconstruction unit is configured to receive sensitivity maps for the respective reception coils together with the measurement data, and the synthesis unit is configured to reconstruct the image by using the measurement data and the sensitivity maps.

According to a second aspect of the invention, an image processing apparatus configured to process an MRI image includes an iterative reconstruction unit configured to reconstruct an image by a repeated calculation using measurement data for each of the reception coils of the MRI apparatus. The iterative reconstruction unit has the same configuration and function as those of the iterative reconstruction unit of the MRI apparatus described above.

According to a third aspect of the invention, an image processing method for processing measurement data collected by a plurality of reception coils of an MRI apparatus and creating a denoised reconstructed image includes: iterative reconstruction of maintaining consistency between denoised k-space data and the measurement data. The iterative reconstruction includes: a step of setting an initial value for the processing based on measurement data for each of the reception coils; a step of synthesizing an image for each of the reception coils; a step of removing noise included in an image before or after the synthesis based on statistical properties of the image and the noise; and a step of creating denoised k-space data for each of the reception coils by using a denoised image and creating estimated measurement data by integrating the denoised k-space data and the measurement data. The processing is repeated while updating the initial value based on the estimated measurement data.

According to the invention, by performing denoising on image data obtained in the repeated calculation for maintaining the consistency, denoising is not affected by aliasing that depends on the undersampling pattern, and thus noise can be removed with high accuracy regardless of the undersampling pattern. In addition, since the aliasing is removed by iterative processing including synthesis using a coil sensitivity distribution, equidistant under-sampling can also be supported.

Further, by combining denoising and data consistency maintenance, excessive smoothing due to denoising can be prevented, and the noise can be removed with high accuracy. As a result, reconstruction and noise removal with high accuracy can be performed on various undersampling patterns including the equidistant under-sampling.

In addition, since a deep learning model of the CNN or the like can be limited to a part of processing of the repeated calculation, universality of a processing target can be expanded while eliminating a large learning model.

BRIEF DESCRIPTION OF THE DRAWINGS

FIG. 5A shows an equidistant undersampling pattern, FIG. 5B shows a non-equidistant undersampling pattern, and FIGS. 5C and 5D show undersampling patterns by a measurement in which data is partially missing or removed.

DESCRIPTION OF THE PREFERRED EMBODIMENTS

Hereinafter, embodiments of an MRI apparatus and an image processing apparatus of the invention will be described with reference to the drawings. First, an embodiment of an MRI apparatus applied with the invention will be described.

Figure 1:
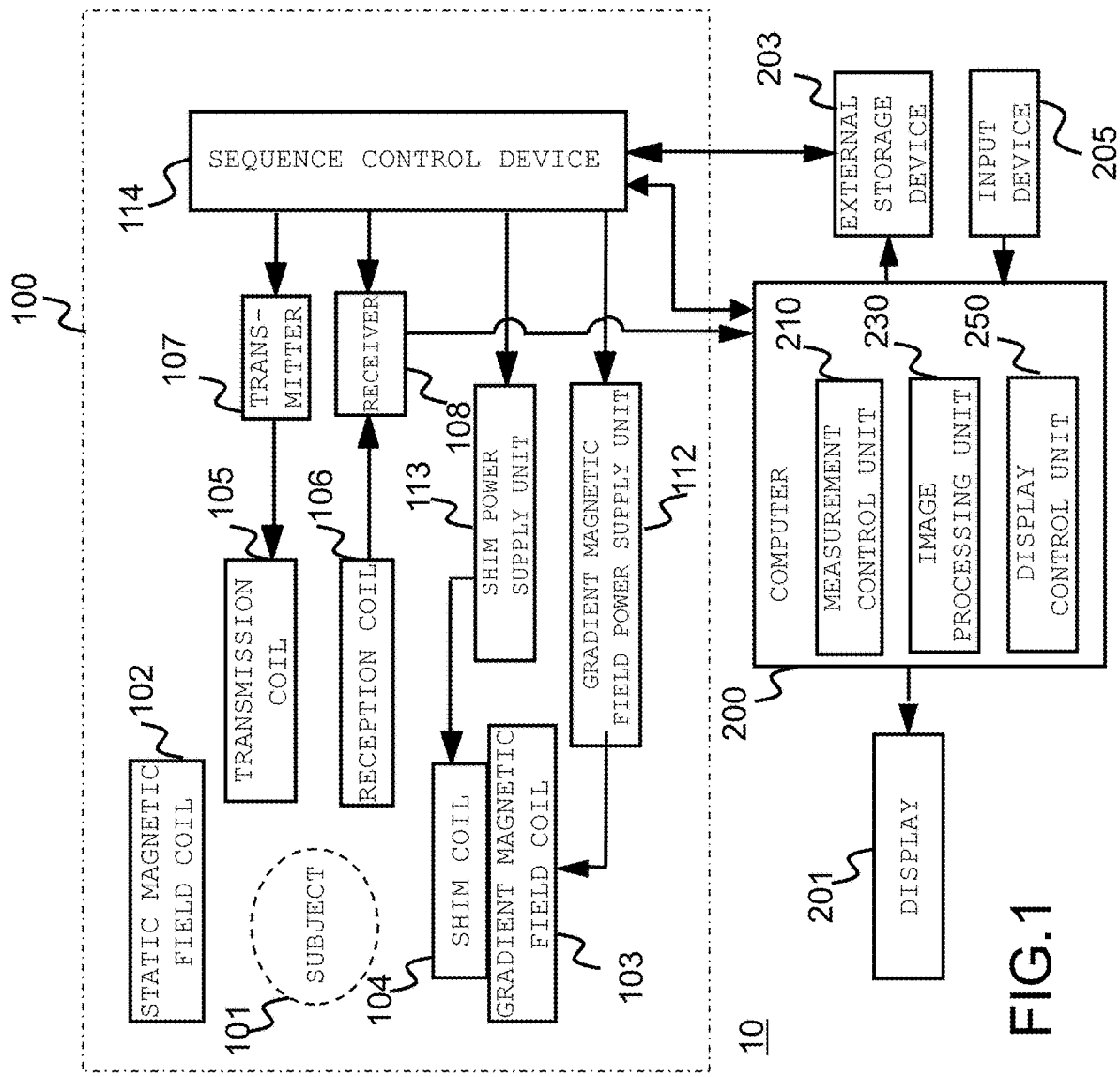
FIG. 1 is an overall configuration diagram showing an embodiment of an MRI apparatus applied with the invention.

As shown in FIG. 1, an MRI apparatus 10 according to the present embodiment roughly includes a measurement unit 100 that measures a nuclear magnetic resonance signal generated from a subject 101, and a computer (calculation unit) 200 that controls the measurement unit 100 and performs image reconstruction, correction, and other calculations by using the nuclear magnetic resonance signal measured by the measurement unit 100.

The measurement unit 100 includes a static magnetic field coil 102 that generates a static magnetic field in a space in which the subject 101 is placed, a transmission unit (105, 107) that transmits a high-frequency magnetic field pulse to the subject 101 arranged in the static magnetic field, a reception unit (106, 108) that receives the nuclear magnetic resonance signal generated by the subject, and a gradient magnetic field coil 103 that applies a magnetic field gradient to the static magnetic field generated by the static magnetic field coil 102 in order to apply position information to the nuclear magnetic resonance signal.

The static magnetic field coil 102 includes a normal conducting or superconducting static magnetic field coil, a static magnetic field generating magnet, or the like, and may be of a vertical magnetic field type, a horizontal magnetic field type, or the like depending on a direction of the generated static magnetic field. A shape of the coil and appearance of the entire apparatus vary depending on the type. The present embodiment can be applied to any type of MRI apparatus.

The transmission unit includes a transmission high-frequency coil 105 (hereinafter, simply referred to as a transmission coil) that transmits a high-frequency magnetic field to a measurement region of the subject 101, and a transmitter 107 including a high-frequency oscillator, an amplifier, and the like. The reception unit includes a reception high-frequency coil 106 (hereinafter, simply referred to as a reception coil) that receives the nuclear magnetic resonance signal generated from the subject 101, and a receiver 108 that includes a quadrature detection circuit, an A/D converter, and the like. In the present embodiment, the reception coil includes a plurality of channels (small-sized reception coils), each of which is connected to the quadrature detection circuit and the A/D converter constituting the receiver 108. A nuclear magnetic resonance signal for each channel (that is, each of the reception coils) received by the receiver 108 is passed to the computer 200 as a complex digital signal.

The gradient magnetic field coil 103 includes three sets of gradient magnetic field coils that apply gradient magnetic fields in an x direction, a y direction, and a z direction, respectively, each of which is connected to a gradient magnetic field power supply unit 112. The MRI apparatus may further include a shim coil 104 that adjusts a static magnetic field distribution and a shim power supply unit 113 that drives the shim coil 104.

The measurement unit 100 further includes a sequence control device 114 that controls an operation of the measurement unit 100. The sequence control device 114 controls operations of the gradient magnetic field power supply unit 112, the transmitter 107, and the receiver 108, and controls timings of applying the gradient magnetic field and the high-frequency magnetic field and receiving the nuclear magnetic resonance signal. The nuclear magnetic resonance signal can be encoded by the gradient magnetic field, and a position and a pattern in a k-space in which the nuclear magnetic resonance signal is arranged as a digital signal are determined by the number of encoding (the number of encoding steps) and respective encoding amounts thereof.

A time chart of control by the sequence control device is called a pulse sequence, and is set in advance according to measurement and stored in a storage device or the like provided in the computer 200.

The computer 200 controls operations of the entire MRI apparatus 100 and executes various calculation processing on the received nuclear magnetic resonance signal. Therefore, as shown in FIG. 1, the computer 200 includes functional units such as a measurement control unit 210, an image processing unit 230, and a display control unit 250. In the present embodiment, the image processing unit (computer) 230 performs image synthesis using a sensitivity distribution of the reception coils, noise removal, data consistency maintenance between measurement data and a restored image, and the like.

The computer 200 is an information processing device including a CPU, a memory, a storage device, and the like, and a display 201, an external storage device 203, an input device 205, and the like are connected to the computer 200.

The display 201 is an interface that displays a result obtained by the calculation and the like to an operator. The input device 205 is an interface for the operator to input conditions, parameters, and the like necessary for the measurement and calculation performed in the present embodiment. A user can input, for example, measurement parameters such as a multiple number of times of speed (also referred to as a reduction factor) in a PI method via the input device 205. The external storage device 203 stores data used for the various types of calculation executed by the computer 200, data obtained by the calculation, input conditions, parameters, and the like, together with a storage device inside the computer 200.

The functions of these units of the computer 200 can be implemented as software embedded in the computer 200, and are implemented by the CPU loading a program (the software) stored by the storage device into the memory and executing the program. Various types of data used for processing of the functions and various types of data generated during the processing are stored in the storage device or the external storage device 203. Some of the various functions implemented by the computer 200 may be implemented by hardware such as an application specific integrated circuit (ASIC) or a field-programmable gate array (FPGA).

Some of the functions implemented by the computer 200, for example, a function of the image processing unit 230 can be implemented by an independent computer or another image processing apparatus that can transmit and receive data to and from the MRI apparatus 10, and such an image processing apparatus is also covered by the invention.

The image processing unit 230 of the present embodiment performs synthesis of images using a sensitivity distribution of each of the reception coils and iterative reconstruction including noise removal and data consistency maintenance, on measurement data on the reception coil obtained by the measurement unit 100 of the MRI apparatus 10 performing a measurement at a predetermined undersampling pattern and a predetermined reduction factor. In these types of processing, transform from k-space data to real space data (inverse Fourier transform), transform from real space data to k-space data (Fourier transform), transform to a sparse space, and the like are performed.

The operation of the MRI apparatus 10 having the above configuration is the same as an operation of a known MRI apparatus. In the measurement unit 100, the measurement control unit 210 receives imaging conditions and pulse sequences selected according to an imaging method or an imaging target or set in advance by an examination protocol, and transmits the imaging conditions and the pulse sequences to the sequence control device 114. The sequence control device 114 controls the transmitter 107, the gradient magnetic field power supply unit 112, the receiver 108, and the like and collects measurement data including a nuclear magnetic resonance signal.

At this time, when the undersampling pattern and the reduction factor are set as the imaging conditions, the number of encoding and the encoding amount applied to the nuclear magnetic resonance signal are controlled so as to achieve the set undersampling pattern and reduction factor.

The measurement data is collected for each of the plurality of small-sized reception coils. The measurement data for each channel corresponding to the small-sized reception coils is arranged in a k-space having a predetermined matrix size and subjected to the image reconstruction. That is, image reconstruction using the measurement data is performed in the image processing unit 230 of the computer 200. At this time, the image processing unit 230 repeatedly performs various calculations such as transform from measurement data to real space data (image data), image synthesis for each channel, removal of noise included in the images, consistency maintenance, and the like. The processing included in the iterative reconstruction is performed by using predetermined algorithms.

Hereinafter, a specific embodiment of a configuration and processing of the image processing unit 230 will be described.

First Embodiment

The present embodiment performs image reconstruction by using measurement data on respective channels measured in a predetermined undersampling pattern and sensitivity distributions of respective reception coils. At this time, denoising of a reconstructed image and a calculation for maintaining consistency between original measurement data and the measurement data on the respective channels created from denoised images are iteratively processed. Accordingly, image restoration and denoising with high accuracy are possible without depending on the undersampling pattern. In addition, a learning model supporting various undersampling patterns is not required, and a burden of preparing learning data can be reduced.

Figure 2:
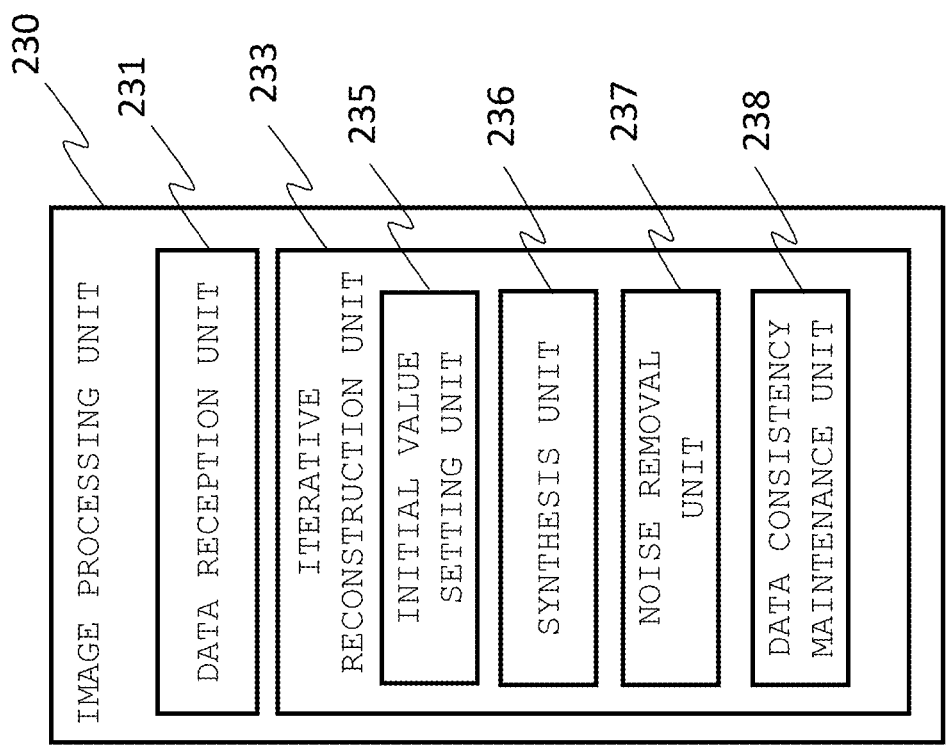
FIG. 2 is a block diagram of a computer according to a first embodiment.

The configuration of the image processing unit 230 according to the present embodiment will be described with reference to FIG. 2. As illustrated in the drawing, the image processing unit 230 includes a data reception unit 231 and an iterative reconstruction unit 233. The iterative reconstruction unit 233 includes an initial value setting unit 235, a synthesis unit 236, a noise removal unit 237, and a data consistency maintenance unit 238.

The data reception unit 231 receives the measurement data (k-space data) of the respective channels. The initial value setting unit 235 sets an initial value for a repeated calculation by the iterative reconstruction unit 233 based on the measurement data received by the data reception unit 231. The initial value for the repeated calculation is data to be processed in any step of the repeated calculation, and may have different forms depending on the step. A case where image data input to the synthesis unit 236 is used as the initial value will be described below.

The synthesis unit 236 synthesizes image data on the respective channels, which is the initial value set by the initial value setting unit 235, to obtain one piece of image data.

The noise removal unit 237 performs noise removal (denoising) on the synthesized image data. Although there are various denoising methods, in the present embodiment, denoising is performed based on statistical properties of an image and statistical properties of noise included in the image. Details of the method will be described later.

The data consistency maintenance unit 238 transforms a denoised image to k-space data for each channel, integrates the k-space data and the original measurement data, and then inversely transforms to real space data to update the initial value. Accordingly, the consistency with the measurement data is maintained.

Figure 3:
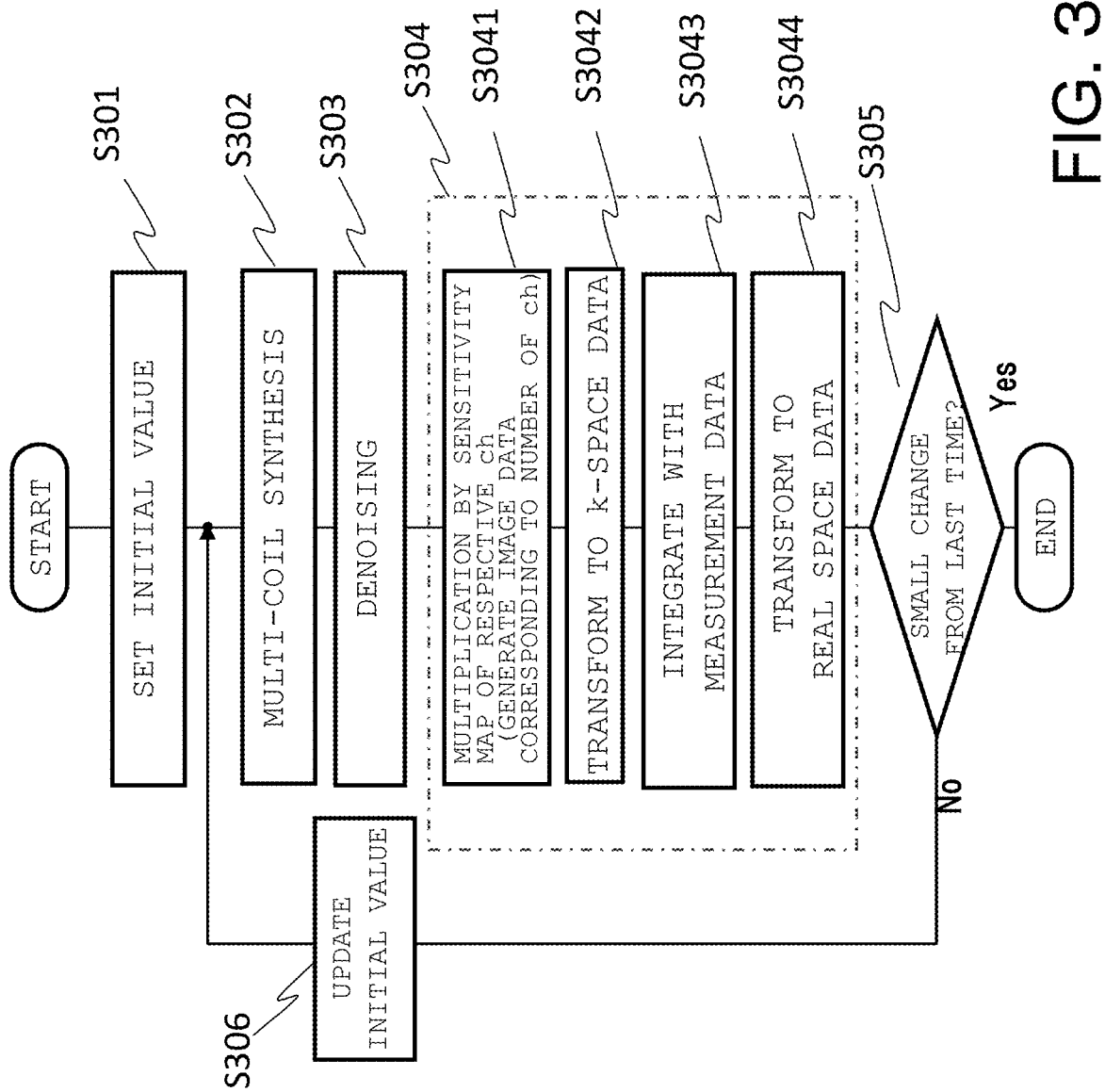
FIG. 3 is a diagram showing a flow of processing according to the first embodiment.
Figure 4:
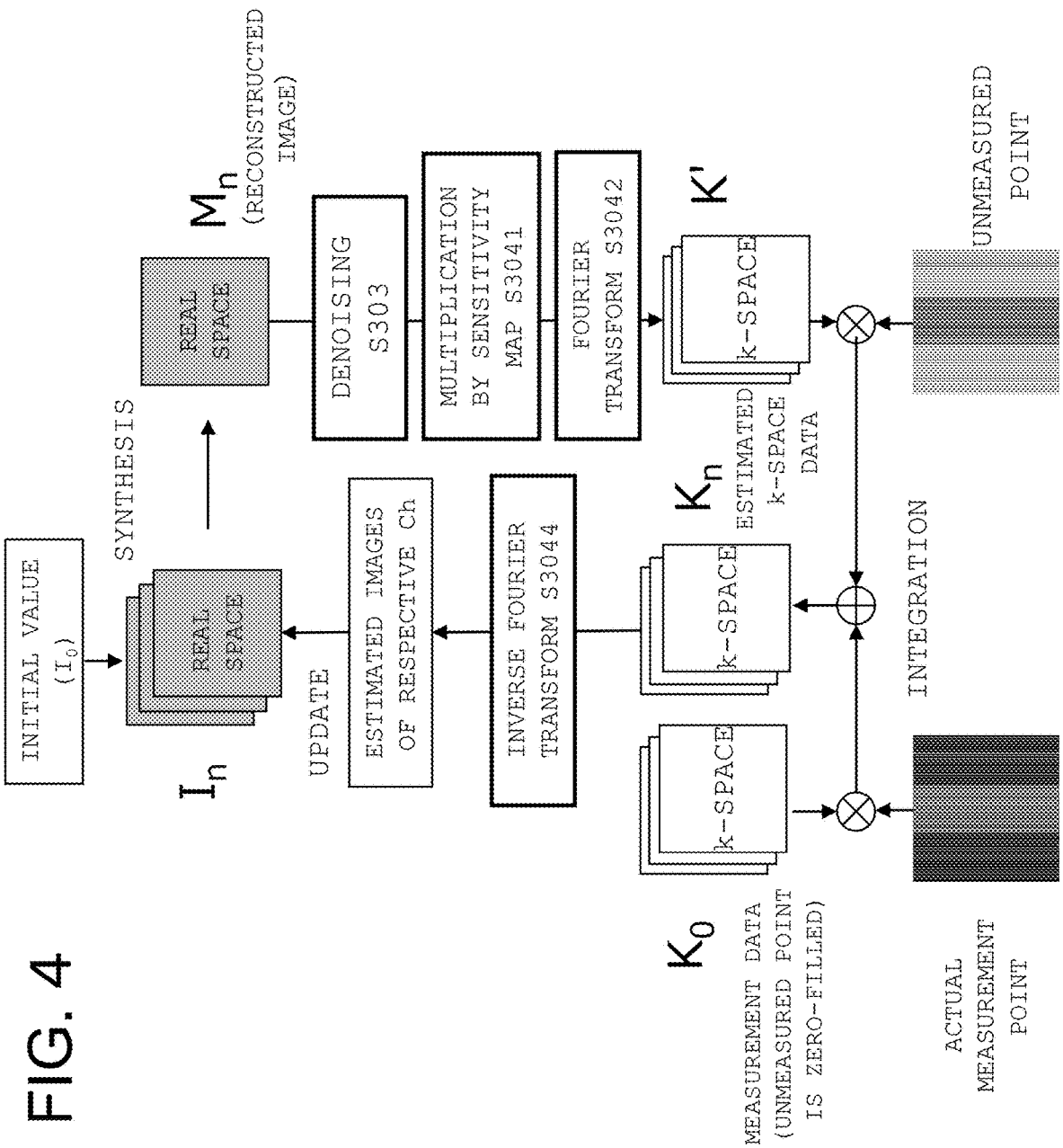
FIG. 4 is a diagram schematically showing the processing according to the first embodiment.
Figure 5D:
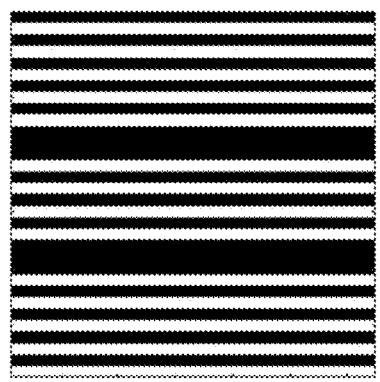
FIGS. 5A to 5D are diagrams showing an example of an undersampling pattern of measurement data acquired by a measurement unit of the MRI apparatus, where
Figure 5C:
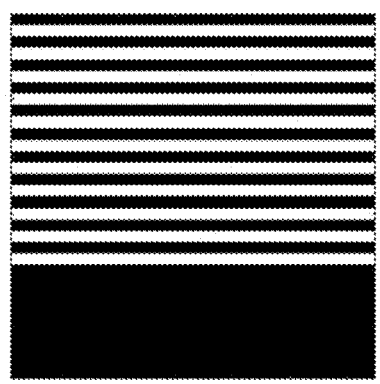
Figure 5B:
Figure 5A:
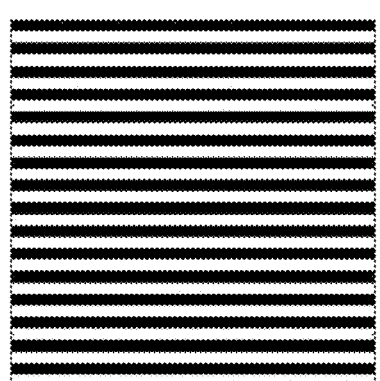

Hereinafter, the processing of the image processing unit 230 according to the present embodiment will be described in detail with reference to FIGS. 3 and 4. FIG. 3 is a diagram showing a flow of the processing of the image processing unit 230, and FIG. 4 is a diagram schematically showing the processing.

Data Reception

In the measurement unit 100, when the measurement data is collected by imaging at predetermined undersampling pattern and reduction factor, the data reception unit 231 receives the measurement data for each channel.

The reduction factor (acceleration rate) is a reciprocal of a ratio of the number of pieces of measurement data to the number of pieces of data on each grid point of the k-space (the acceleration rate is 2 if the ratio is 1/2).

As shown in FIGS. 5A to 5D, the undersampling patterns include an equidistant undersampling pattern (a) in which k-space data is equidistantly undersampled, a non-equidistant undersampling pattern (b) randomly sampled with a uniform or a non-uniform probability density, a pattern (c) in which data on a partial region is removed because of partial interruption of a measurement of equidistant undersampling or non-equidistant undersampling and a pattern (d) in which a line satisfying a predetermined condition is removed based on the equidistant or non-equidistant pattern. The predetermined condition of the pattern (d) is, for example, influence of body motion. In this case, there is a method of acquiring navigator echoes corresponding to measurement points or measurement lines, and removing measurement points or measurement lines whose error from a reference navigator echo is equal to or greater than a certain value. In addition, various body motion detection methods can be used.

Although not shown in FIGS. 5A to 5D, there is also a pattern in which in order to acquire a sensitivity map of each coil from the measurement data, only a central region is fully scanned and only a periphery thereof is subjected to equidistant undersampling. Further, there is also a case of non-Cartesian scanning in which the k-space is radially or spirally scanned.

When the reduction factor and the undersampling pattern are set in advance, the image processing unit 230 performs the processing by using the set information. In addition, information indicating a measurement point and a non-measurement point, such as a mask indicating a measurement point, may be received by the data reception unit 231 together with the measurement data.

Step S301

The initial value setting unit 235 sets an initial value $I_0$ of the repeated calculation of the iterative reconstruction unit 233 based on input measurement data. In the present embodiment, since the repeated calculation is performed based on the real space data, the initial value setting unit 235 transforms measurement data on the respective reception coils (hereinafter, also referred to as measurement data on the respective channels) to real space data to obtain the initial value. The measurement data is data in which a part of the k-space is undersampled, and thus is transformed to real space data with unmeasured data being estimated.

For example, an unmeasured point in the k-space is zero-filled, and subjected to inverse Fourier transform to obtain the real space data. In addition, after data on one image is created by a known parallel imaging calculation (referred to as parallel reconstruction) such as SENSE, the image data on the respective channels may be created by multiplying the image data by sensitivity maps for the respective reception coils, so as to be used as initial values of images of the respective channels. In a case of non-equidistant undersampling, the parallel reconstruction is performed only on an equidistant part.

According to studies by the present inventors, when an image created by zero-filling is used as the initial value, it is necessary to increase the number of times of the repeated calculation in order to remove aliasing, and on the other hand, when a parallel-reconstructed image is used as the initial value, the aliasing is removed, so that the repeated calculation converges quickly.

The initial value setting unit 235 may further apply filtering such as a Gaussian filter or a bilateral filter to the above image. At this time, a filter intensity may be changed by a G-factor map representing a noise amplification ratio of parallel imaging. The denoising performed by the initial value setting unit 235 is different from the denoising performed by the noise removal unit 237 described later. By performing the parallel reconstruction and the filtering during initial value setting, since the aliasing and the noise are reduced in advance before the repeated processing is started, the number of times of repetition can be reduced.

Steps S302 to S305

The iterative reconstruction unit 233 performs the following repeated calculations by using the initial value $I_0$ set by the initial value setting unit 235 as the initial value of the image data on the respective channels.

Step S302: Synthesis

Figure 6:
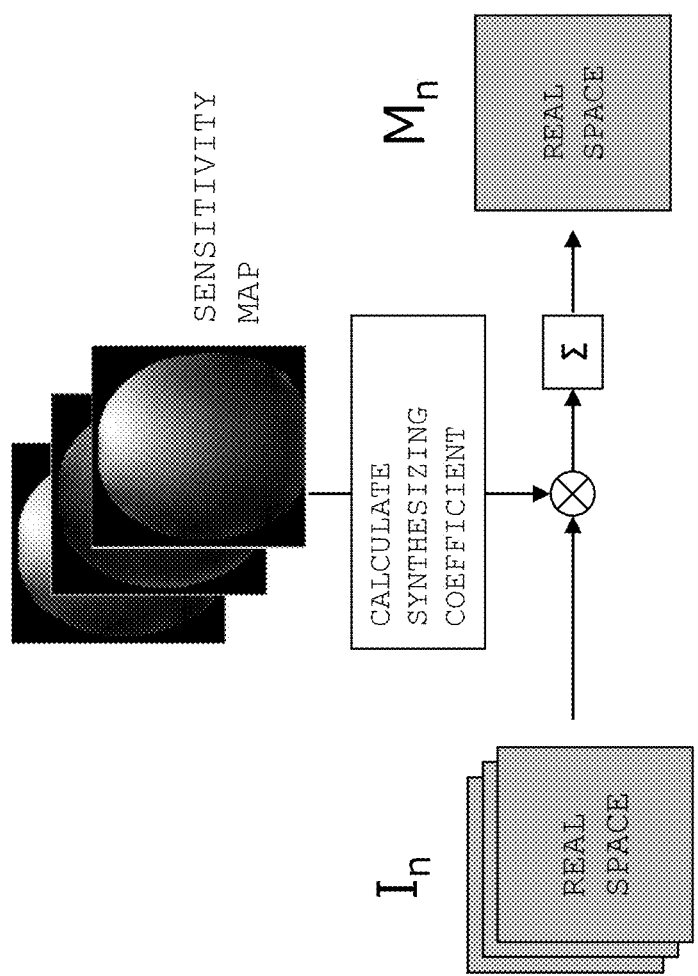
FIG. 6 is a diagram showing an example of processing by a synthesis unit.

First, the synthesis unit 236 synthesizes the image data on the reception coil by using the sensitivity map for the reception coil. As shown in FIG. 6, the synthesizing method includes so-called multi-array coil (MAC) synthesis of multiplying image data $I_n$ of the respective channels by a coefficient corresponding to the sensitivity map and summing the channels to obtain data $M_n$ on one image. The subscript n of $I_n$ and $M_n$ is a code indicating an n-th time of the repeated calculation (the same applies hereinafter), and the initial value $I_0$ is used for an initial $I_n$. $I_n$ addition to the MAC synthesis, the synthesis of the image data may be summing on the k-space, including convoluting a kernel corresponding to the sensitivity map with the k-space data on the respective channels and summing the channels.

Step S303: Denoising

Thereafter, the noise removal unit 237 performs denoising on the synthesized image data $M_n$ in the real space. The denoising is based on the statistical properties. The statistical properties of the image and the noise are typically reflected in a pixel value distribution and a noise distribution. Here, denoising is performed by using a predetermined algorithm using a difference between a noise distribution and a distribution of a vector including all or a part of pixel values of the reconstructed image or a vector obtained by transforming the vector. Alternatively, since the statistical properties are inherent in past data, predetermined parameters of the algorithm for separating the noise from the reconstructed image may be adjusted based on the past data.

Specifically, examples include a combination of wavelet transform and soft threshold processing (Approach 1), reconstruction using a dictionary representing a local structure such as sparse modeling or sparse coating (Approach 2), a deep learning model such as a convolutional neural network (CNN) learned to remove Gaussian noise (Approach 3).

In Approach 1, the reconstructed image is sparse, that is, the number of zero elements of the wavelet transform is large. On the other hand, the noise is not sparse, but has a value smaller than elements of the reconstructed image. Such a difference in statistical properties between the two elements is used. Therefore, as shown in the following Equation (1), first, image data (including noise) M is subjected to wavelet transform ($\Psi$) and separated into a plurality of elements. Regarding this, soft threshold processing ($S_\lambda$) is performed for each of the elements, and elements having a small value are removed. The result is subjected to inverse wavelet transform ($\Psi^{-1}$) to obtain image data M'.

$$M' = \Psi^{-1}(S_\lambda)(\Psi(M))) \tag{1}$$

In Equation (1), M represents the image data by a vector inclusive of all pixels, and $S_\lambda$ is a function for performing soft threshold processing using a threshold $\lambda$ for each of the elements of the vector. The threshold $\lambda$ of the soft threshold processing can be freely adjusted according to the denoising intensity, and may be set by default, set by the user, or adjusted according to a noise amount estimated by a method described in an embodiment described later. Approach 1 and Approach 2 can perform noise removal with a smaller calculation load than when using the deep learning model.

Figure 7:
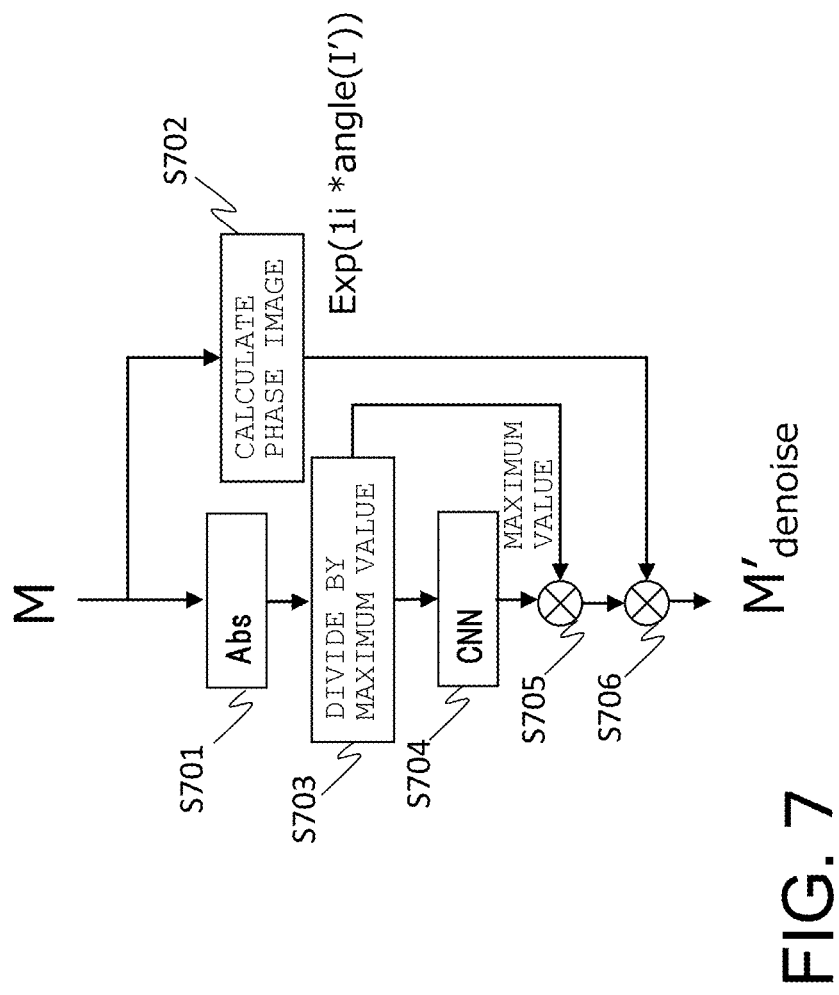
FIG. 7 is a diagram showing an example of denoising using a CNN.

An example of Approach 3 uses a CNN, specifically, a CNN learned to remove noise by using a combination of an image having a small amount of noise (correct image) and an image having a large amount of noise at the same position among images acquired in past. More specifically, examples of the image having a large amount of noise include an image acquired by increasing the reduction factor at the same position as the correct image or an image created by artificially adding complex Gaussian noise to the correct image (complex image or absolute value image). FIG. 7 shows an example of denoising using a CNN of an absolute value image. In this example, the absolute value image and a phase image are calculated from the image M (S701, S702), and each pixel value of the absolute value image is divided by a maximum value to be input to the CNN (S703, S704). The output of the CNN, that is, a denoised image is multiplied by the maximum value (S705), and multiplied by the phase image calculated in S702 (S706) to obtain a denoised image (complex image).

In the example shown in FIG. 7, denoising using a CNN is performed only on the absolute value image, but denoising can also be performed on the complex image. In a case of performing processing on the complex image, the CNN may be configured by using a real part channel and an imaginary part channel as input and output channels, or a known network for handling complex may be used. Processing as a complex image allows denoising inclusive of a phase, and improves the accuracy of noise removal.

Figure 8:
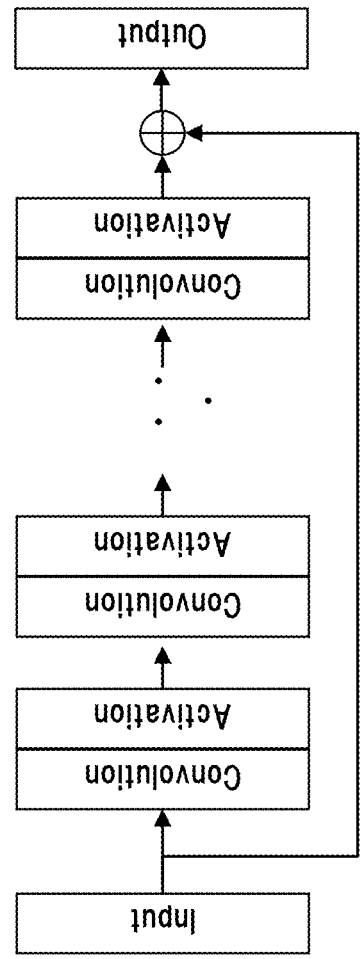
FIG. 8 is a diagram showing a configuration example of the CNN.

A structure and the number of layers of the CNN are not particularly limited, and for example, a CNN having a general structure in which a convolutional layer and an active layer are sequentially connected may be used. Preferably, as shown in FIG. 8, by adopting a form of residual learning of summing the input and then outputting the sum, the network learns a difference from the correct image, and the accuracy of noise removal is improved.

High accuracy can be expected by increasing the number of layers of the CNN or using a complicated network such as a U-Net in which layers of a plurality of resolutions are connected. In the present embodiment, since an error in noise removal is also reduced in the data consistency maintenance unit 238 described later, the number of layers of the CNN may be small, and, for example, a CNN having three layers to five layers may be used. Since the denoising according to the present embodiment is repeated as a part of the iterative reconstruction, the reduction in the number of layers can simplify not only the denoising but also the entire iterative reconstruction.

Approach 3 (using CNN) can mainly remove Gaussian noise, whereas the CNN can also be learned to remove aliasing artifacts, ringing artifacts, body motion artifacts and the like included in the image as noise, thereby reducing artifacts and the like together with the noise.

Step S304: FT

Next, the data consistency maintenance unit 238 returns the denoised image data M' to the k-space data on the respective channels. Specifically, the image data M' is multiplied by the sensitivity maps of the respective reception coils (S3041) and then subjected to Fourier transform to obtain k-space data K' of the respective channels (S3042).

The data consistency maintenance unit 238 integrates the k-space data K' and measurement data $K_0$ received by the data reception unit 231 to keep consistency between both (S3043). For example, as shown in FIG. 4, data on unmeasured points (estimated data) in the k-space data K' and data on measurement points that are actually measured in the measurement data $K_0$ (sized to a matrix in the k-space with the unmeasured points zero-filled) are integrated. That is, a measurement point in the k-space data K' of the respective channels is replaced with measurement data on the same position (Approach 1).

Alternatively, data on a measurement point in the k-space data on the respective channels and data on the same position in the measurement data $K_0$ may be subjected to weighted summing (Approach 2). That is, the integration is performed according to the following Equation (2). In Equation (2), $\lambda_{DC}=0$ in Approach 1, and $\lambda_{DC}>0$ in Approach 2.

$$K_n = (E - U)K' + \frac{1}{(1 + \lambda_{DC})} U(\lambda_{DC} K' + K_0) \tag{2}$$

In Equation (2), U represents an operation of multiplying 1 to a measurement point and 0 to an unmeasured point in the k-space. E is a unit matrix, and (E−U) is a matrix representing an operation of multiplying 0 to a measurement point and 1 to an unmeasured point in the k-space. Actually, instead of calculating the matrix, a result of Equation (2) can be obtained faster by calculating the elements in the k-space.

Approach 1 is fast in processing, but can only remove the noise in data in which the unmeasured part is complemented, whereas Approach 2 can also remove noise in the measurement data per se.

The data consistency maintenance unit 238 performs inverse Fourier transform on k-space data Kn of the respective channels after the integration to obtain the real space data.

Steps S305 and S306

The iterative reconstruction unit 233 updates the initial value with the real space data on the respective channels integrated and created by the data consistency maintenance unit 238 (S306), and repeats the above steps S302 to S304. At this time, a difference between the initial values before and after the update is obtained, and when the difference is smaller than an error set in advance, the repeated calculation is ended (S305). Upon the end of the calculation, a reconstructed image Mn synthesized with real space data $I_n$ before the update is output by the iterative reconstruction unit 233.

As described above, the MRI apparatus (image processing unit) of the present embodiment performs the repeated calculation of denoising and data consistency maintenance, so that the iterative reconstruction can be performed while maintaining the consistency with the measurement data regardless of the undersampling pattern at the time of measurement, and excessive denoising can be prevented. In addition, since the aliasing of equidistant undersampling is removed by iterative reconstruction including synthesis using a coil sensitivity distribution and data consistency maintenance, this embodiment can also be applied to equidistant undersampling.

First Modification of First Embodiment

In the first embodiment, the image data on the respective channels used for the MAC synthesis by the synthesis unit 236 is set as the initial value, but the initial value may be any one of the real space data and the k-space data used in each step of the repeated calculation shown in FIG. 4.

Figure 9:
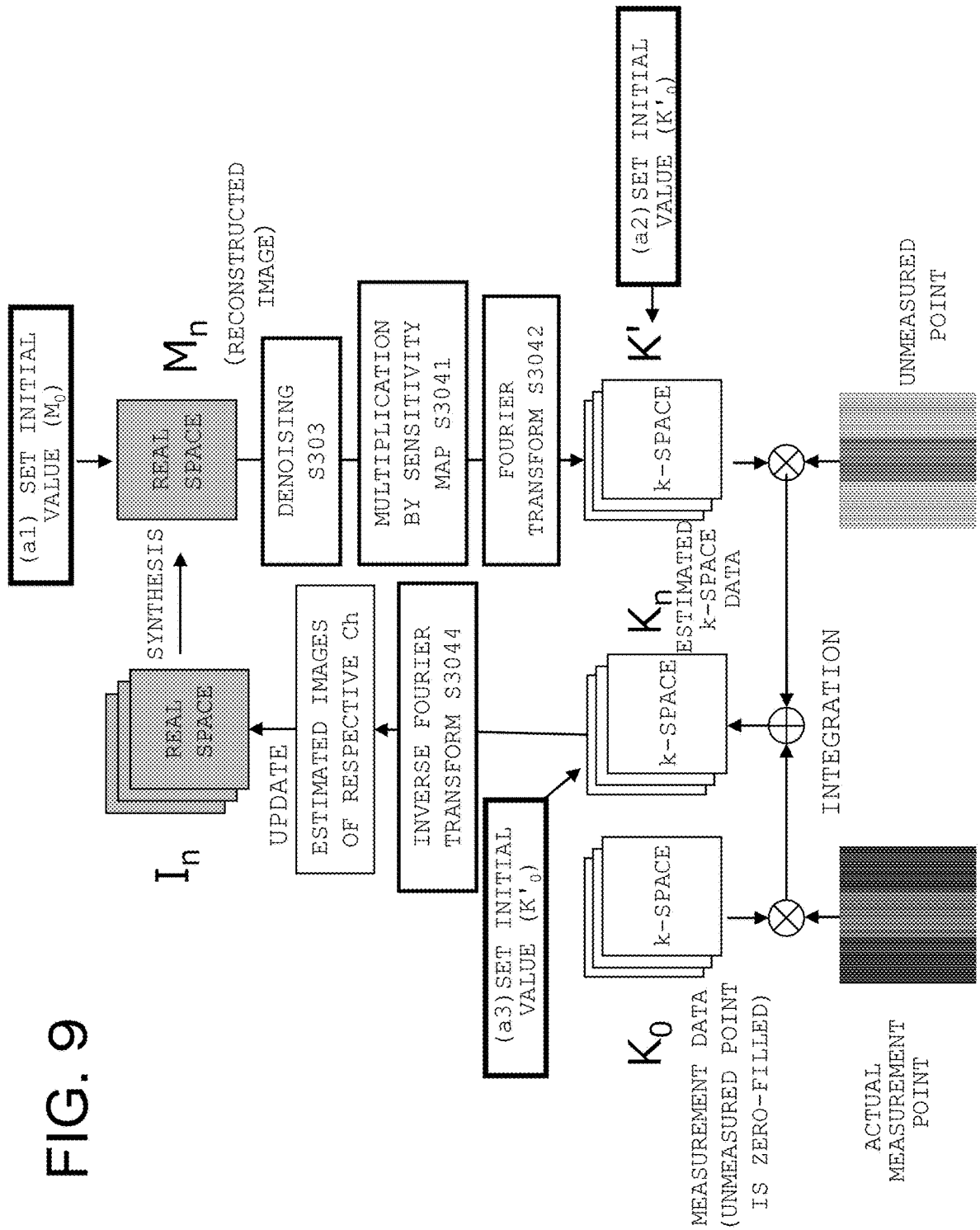
FIG. 9 is a diagram showing a modification of the processing according to the first embodiment.

FIG. 9 shows steps in which the initial value can be set. FIG. 9 corresponds to the processing of FIG. 4, and steps of initial value setting in place of (a) initial value setting of FIG. 4 are shown by (a1), (a2), and (a3). The initial value setting unit 232 sets an initial value used in any one of these steps.

In a case of (a1), the processing starts from the denoising S303 with an image reconstructed by using measurement data received by the data reception unit 231 as an initial value. Reconstruction from the measurement data may be MAC synthesis or reconstruction using parallel imaging calculation. (a2) and (a3) use k-space data as the initial value, and the k-space data is used as the initial value either before or after the integration. In a case of (a2), transformation to k-space data on the respective channels (estimated k-space data in which unmeasured points are estimated) is performed with or without denoising the reconstructed image Mn, thereby obtaining an initial value $K'_0$ of the k-space data K' before the integration. In a case of (a3), the k-space data $K'_0$ of the respective channels in (a2) and the measurement data $K_0$ are integrated into an initial value $K'_0$ of estimated k-space data K'.

In either case, the processing is the same except that different starting points of the repeated calculation, and the same effects as in the first embodiment can be obtained. The first embodiment and the case of (a1) both use the real space data as the initial value, and thus can easily receive data after performing various known corrections in the real space such as a distortion correction, and add a step of filtering for noise removal before obtaining the initial value. In the cases of (a2) and (a3), since the k-space data measured from the apparatus is used as it is as the initial value, the system can be simplified.

Second Modification of First Embodiment

In the first embodiment, the images of the respective channels are synthesized, and denoising is performed on the synthesized image, whereas in the present embodiment, denoising is performed on an image for each channel.

Figure 10:
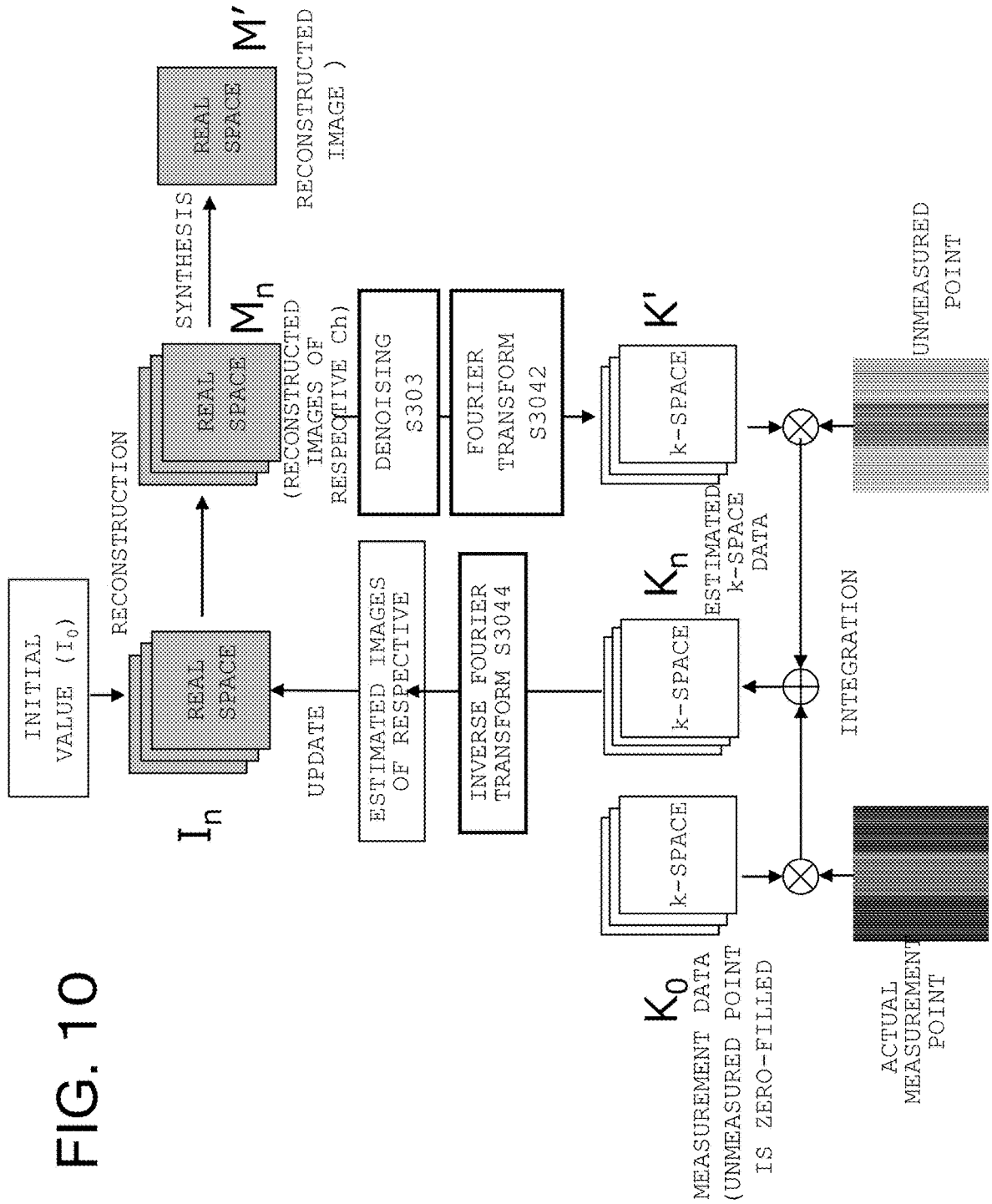
FIG. 10 is a diagram showing another modification of the processing according to the first embodiment.

The processing according to the present embodiment is shown in FIG. 10. In FIG. 10, the same processing as in FIG. 4 is denoted by the same reference numeral, and detailed description thereof will be omitted. The present embodiment also shows a case where image data on the respective channels created based on measurement data is set as an initial value, which can be modified similarly to the first modification.

In the present embodiment, the synthesis unit 236 creates a reconstructed image, i.e., an image in which aliasing is removed, for each channel (reconstruction for each channel). The processing of the synthesis unit 236 according to the first embodiment generates one image from the data for each channel, whereas the processing according to the present embodiment is different in that the reconstructed image for each channel is created by using information on the sensitivity map. Examples of the method for creating the reconstructed image for each channel include a method of convolving a kernel calculated from the sensitivity map into k-space data, such as SPIRIT.

The noise removal unit 237 performs denoising on the reconstructed image for each channel created by the synthesis unit 236 (S303). The denoising is the same as that in the first embodiment, and is performed by using a predetermined algorithm (including CNN) based on statistical properties of the image and the noise. Denoised image data is returned to the k-space data to obtain the k-space data K' for each channel (S3042). The subsequent integration (S3043), inverse Fourier transform (S3044), and initial value update (S305) in the data consistency maintenance unit 238 are the same as in the first embodiment.

The iterative reconstruction unit 233 obtains a difference between initial values before and after the update, and ends the repeated calculation when the difference is smaller than a preset error. Thereafter, the synthesis unit 236 performs MAC synthesis on reconstructed images Mn of the respective channels immediately before, and ends the processing.

The present modification can improve the image quality by using a reconstruction method in which aliasing artifacts are less likely to occur, such as SPIRIT.

Second Embodiment

The present embodiment is characterized in that a function of estimating a noise amount of an image is added to the configuration of the first embodiment, and various coefficients and weights (collectively referred to as parameters) used for the repeated calculation can be adjusted based on the estimated noise amount.

Figure 11:
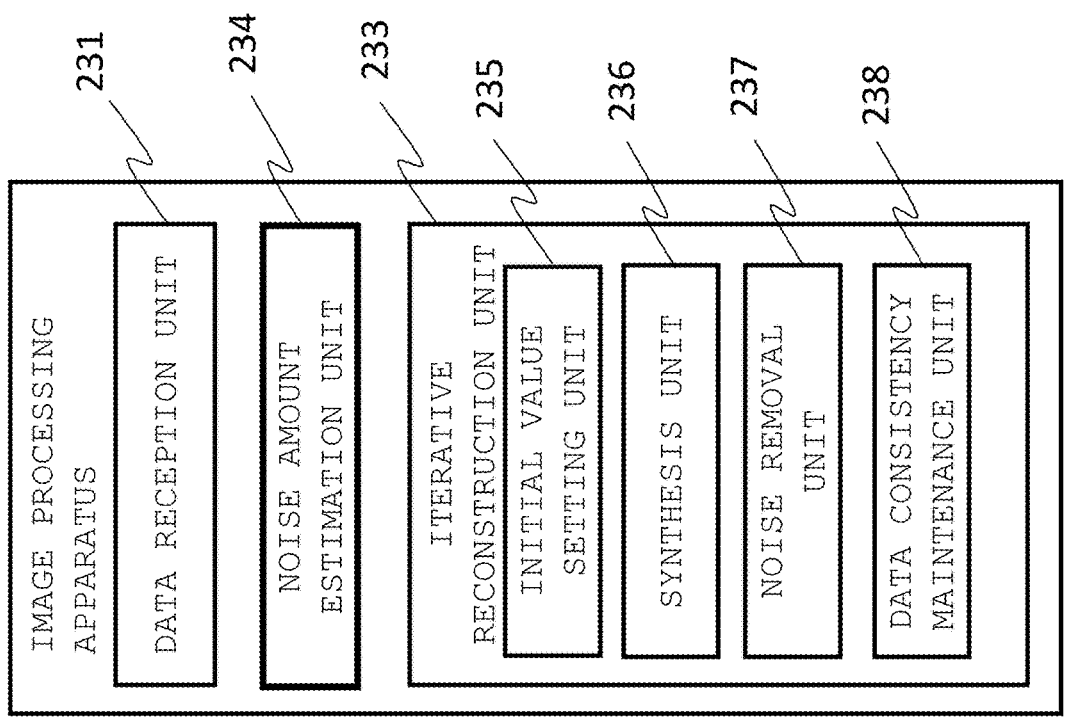
FIG. 11 is a block diagram of a computer according to a second embodiment.

FIG. 11 shows a configuration of the image processing unit 230 according to the present embodiment. In FIG. 11, elements having the same functions as those in FIG. 2 are denoted by the same reference numerals, and redundant description thereof will be omitted. As shown in FIG. 11, the image processing unit 230 according to the present embodiment includes a noise amount estimation unit 234.

Figure 12:
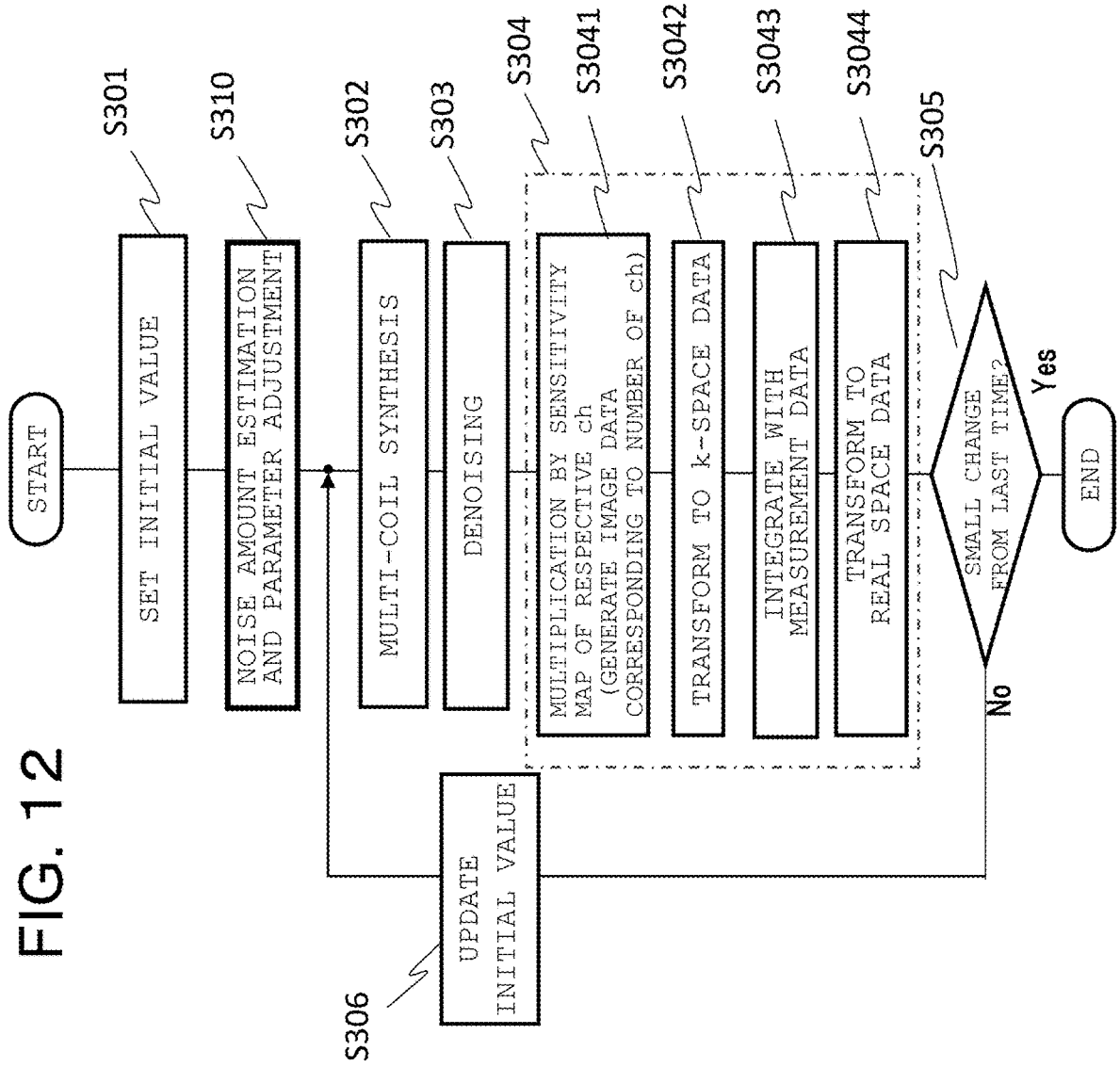
FIG. 12 is a diagram showing a flow of processing according to the second embodiment.

A flow of processing in the present embodiment is the same as in the first embodiment and the modifications thereof, except that noise amount estimation and adjustment based on the noise amount (S310) are added as shown in FIG. 12, and the different processing will be mainly described below.

The noise amount estimation unit 234 estimates the noise amount by using a parallel-reconstructed image. The parallel-reconstructed image may be a reconstructed image generated by the synthesis unit 236 in a first repeated calculation, or may be a reconstructed image used for creating channel image data when the initial value setting unit 235 sets image data of the respective channels as an initial value after parallel reconstruction.

Figure 13:
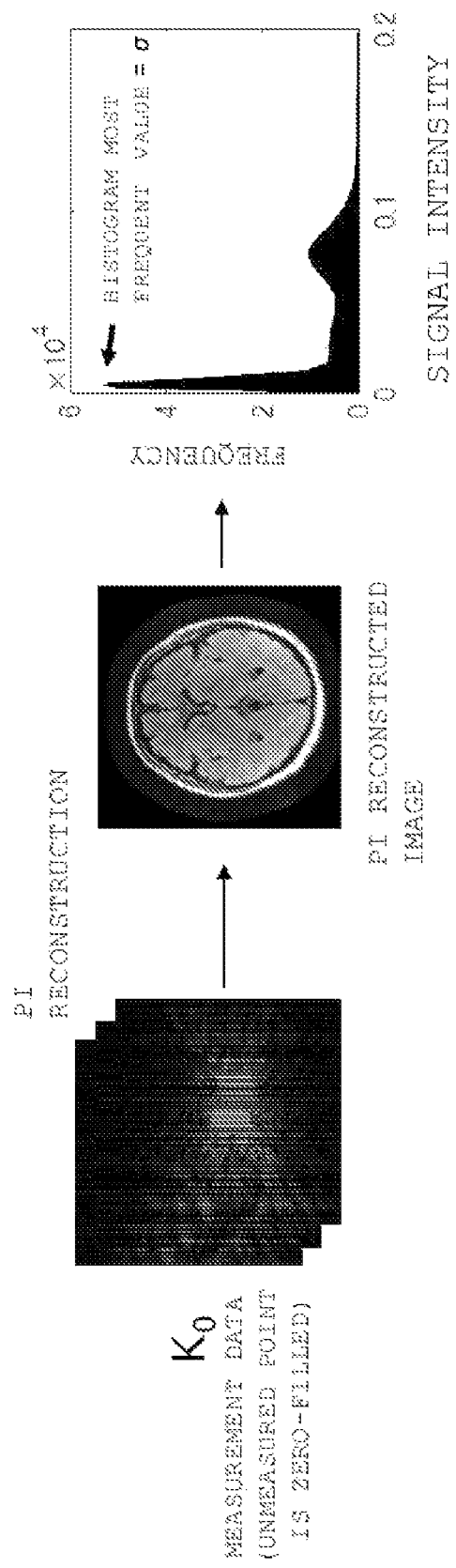
FIG. 13 is a diagram showing an example of noise estimation.

Examples of the method for estimating the noise amount from the image include a method of calculating a standard deviation or a most frequent value of noise from a signal intensity distribution (histogram) of the image as a noise amount σ. As shown in a histogram of FIG. 13, since the noise appears at a frequency higher than that of an image signal in a region where the signal intensity is small, the noise amount can be calculated by distinguishing the noise from the signal based on the distribution.

In addition, instead of using the signal intensity distribution, the noise amount may be calculated by taking out information obtained by excluding a subject part from an image reconstructed as described above. For example, a background part of the image may be extracted, and a standard deviation or a most frequent value of a signal intensity of the background part may be used as the noise amount. Further, a spatially differentiated image of the reconstructed image may be created. The spatially differentiated image is an image exclusive of a signal component having a signal change more moderate than the noise, that is, a component derived from the subject. Then, the noise amount may be calculated from a signal value of the spatially differentiated image.

When calculating the noise amount from the reconstructed image, the image may be corrected by a G-factor or an R-factor (reduction factor) of the parallel reconstruction. The G-factor is information of a map representing a spatial distribution of a noise amplification ratio in parallel reconstruction. Therefore, a noise amount independent of the G-factor can be calculated by dividing each pixel value of the image by the value of the G-factor of a corresponding position. The reduction factor is a single value, but since the noise amount generally increases in proportion to a square root of the reduction factor, a noise amount independent of the reduction factor can be calculated by dividing by the square root of the reduction factor. Due to such correction, a dependency on reconstruction processing can be reduced and the parameters can be adjusted according to the noise amount of measurement data per se, so that the denoising accuracy is stabilized.

In addition to the above methods, examples of the method for estimating the noise amount include various methods of calculating the noise amount based on the reconstructed image, the measurement data, or an image calculated based on the same.

The noise amount calculated by the noise amount estimation unit 234 is used for adjusting a function or an algorithm used in the steps of the repeated calculation in the iterative reconstruction unit 233, mainly in the noise removal unit 237, a coefficient or a threshold of the CNN or the like, switching of the CNN, and the like.

For example, when the noise removal unit 237 performs wavelet transform and soft threshold processing, the threshold λ of the soft threshold processing is adjusted as λ=W·σ or the like. W is a constant, and may be set by default or adjusted by the user. In addition, λ may be determined by a polynomial or the like of the noise amount σ.

When the noise removal unit 237 is a CNN, for example, a plurality of CNNs, such as a CNN learned with training data having a large noise amount and a CNN learned with training data having a small noise amount, may be prepared as the CNN, and the CNN may be switched based on the noise amount σ. Specifically, a configuration of the network per se such as a total number of the CNNs, a weight of each neuron, and the like are switched.

In addition, although two methods have been described as the processing of the data consistency maintenance unit 238 in the first embodiment, a value of "$\lambda_{DC}$" in Equation (2) common to these methods may be varied depending on the noise amount σ to switch the methods or to adjust weighting of data upon the integration. As an example, when the noise amount is large, the integration is performed by adjusting to a large weight of denoised k-space data.

The iterative reconstruction unit 233 performs the repeated calculation under conditions adjusted based on the noise amount estimated by the noise amount estimation unit 234. The processing of the iterative reconstruction unit 233 is the same as in the first embodiment and the modifications thereof, and description thereof will be omitted.

According to the present embodiment, the denoising intensity can be adjusted according to the noise amount included in the image and denoising accuracy can be improved. Moreover, excessive denoising can be prevented by repeating the denoising together with data consistency maintenance.

Modification of Second Embodiment

Figure 14:
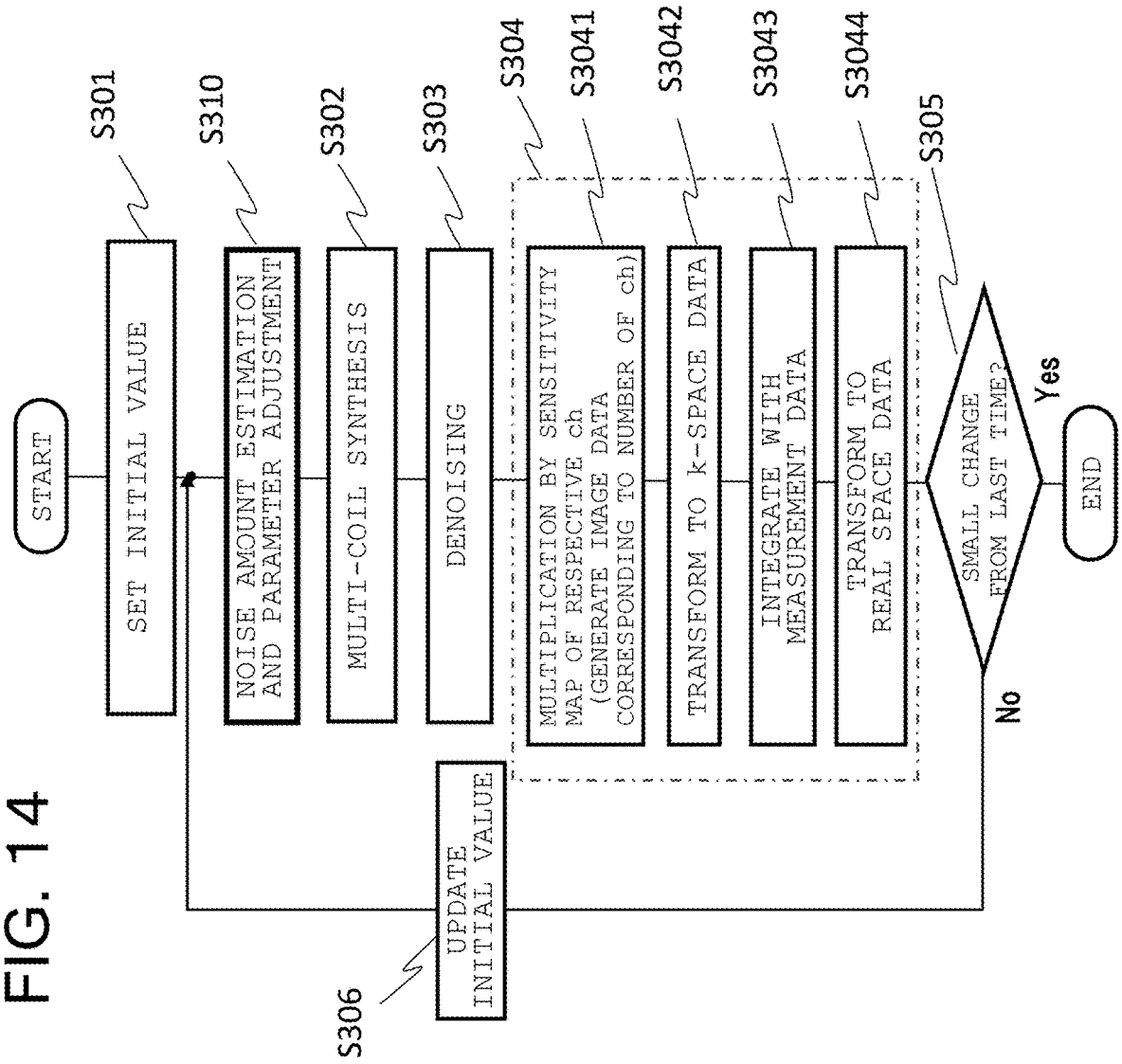
FIG. 14 is a diagram showing a flow of a modification of the processing according to the second embodiment.

In the processing according to the second embodiment shown in FIG. 12, the noise amount estimation processing S310 is performed prior to the repeated calculation, but as shown in FIG. 14, the noise amount estimation and adjustment may be processed within the repeated calculation. In this case, in a configuration diagram of FIG. 11, the noise amount estimation unit 234 is changed to be provided in the iterative reconstruction unit 233.

In the present modification, after the initial value is updated after the processing by the data consistency maintenance unit 238, the noise amount estimation and the adjustment for parameters and the like are performed again on the updated image data, and then subjected to the subsequent processing (such as denoising and integration). In FIG. 14, step S310 is processed in a preceding stage of the synthesis S302, but may be processed in a subsequent stage of the synthesis S302.

According to the present modification, a calculation amount of the repeated calculation increases, whereas denoising can be performed more appropriately.

The embodiments of processing methods performed by the MRI apparatus and the image processing unit thereof according to the invention has been described above. The processing (methods) that can be employed in each step described in these embodiments can be combined as appropriate, so that efficiency of the repeated calculation can be achieved.

In addition, the image processing apparatus of the invention has the function of the image processing unit 230 of the MRI apparatus described above (for example, the element shown in FIG. 2), and can be constructed on a general-purpose computer or workstation. Processing contents are the same and redundant description thereof will be omitted. It will be needless to say that such an image processing apparatus may have a general image processing function in addition to the functions described above, or may include an accessory device (input/output device or storage device) of the computer 200 shown FIG. 1.

What is claimed is:

1. A magnetic resonance imaging apparatus comprising:
a measurement unit including a plurality of reception coils and configured to collect a nuclear magnetic resonance signal of a subject for each of the reception coils;
a control unit configured to control a collection pattern for the nuclear magnetic resonance signal; and
an image processing unit configured to reconstruct a denoised image of the subject by using measurement data including the nuclear magnetic resonance signal collected for said each of the reception coils, wherein the image processing unit includes:
a noise amount estimation unit configured to estimate a noise amount of a parallel-reconstructed image, the noise estimation including correction of the parallel-reconstructed image (i) by a G-factor representing a spatial distribution of a noise amplification ratio and (ii) by an R-factor as a reduction factor; and
an iterative reconstruction unit configured to reconstruct a reconstructed image by a repeated calculation using the measurement data for each of the reception coils,
wherein the iterative reconstruction unit includes:
an initial value setting unit configured to set initial image data for the repeated calculation based on the measurement data for each of the reception coils;
a synthesis unit configured to synthesize a synthesized image for each of the reception coils;
a noise removal unit configured to remove noise included in the synthesized image based on statistical properties of the synthesized image and the noise and based on a parameter adjusted based on the estimated noise amount; and
a data consistency maintenance unit configured to create denoised k-space data for each of the reception coils, by using the denoised image and to create estimated measurement data by integrating the denoised k-space data and the measurement data, and
the iterative reconstruction unit is configured to perform iterative processing while updating the initial value based on the estimated measurement data.

2. The magnetic resonance imaging apparatus according to claim 1, wherein
the measurement data is data undersampled in a predetermined undersampling pattern,
the iterative reconstruction unit is configured to receive sensitivity maps for the plurality of reception coils together with the measurement data, and
the synthesis unit is configured to synthesize the synthesized image by using the measurement data and the sensitivity maps.

3. The magnetic resonance imaging apparatus according to claim 1, wherein the initial value setting unit is configured to set estimated images of the plurality of reception coils as an initial value of the image data for each of the reception coils used by the synthesis unit, the estimated images being obtained by transforming the measurement data for each of the reception coils to real space data by inverse Fourier transform.

4. The magnetic resonance imaging apparatus according to claim 2, wherein the initial value setting unit is configured to set estimated images of the plurality of reception coils as initial values of images for the respective reception coils used by the synthesis unit, the estimated images being created by using images reconstructed from the measurement data for the plurality of reception coils and the sensitivity maps for the reception coils.

5. The magnetic resonance imaging apparatus according to claim 1, wherein
the initial value setting unit is configured to set the image reconstructed from the measurement data for each of the reception coils as an initial value of the image after the synthesis used by the noise removal unit.

6. The magnetic resonance imaging apparatus according to claim 1, wherein
the initial value setting unit is configured to set the denoised k-space data for each of the reception coils or estimated k-space data obtained by integrating the denoised k-space data and the measurement data as an initial value.

7. The magnetic resonance imaging apparatus according to claim 1, wherein the noise removal unit is configured to perform denoising by using a difference between a noise distribution and a distribution of a vector including at least a part of pixel values of an image to be processed or a transformed vector obtained by transforming the vector.

8. The magnetic resonance imaging apparatus according to claim 7, wherein
the noise removal unit is configured to perform a sparse transform for transforming the image to be processed to a sparse space and to perform denoising by performing soft threshold processing on data after the sparse transform.

9. The magnetic resonance imaging apparatus according to claim 1, wherein
the noise removal unit includes a neural network learned with past data as learning data, and is configured to perform denoising based on the past data.

10. The magnetic resonance imaging apparatus according to claim 9, wherein
the neural network is learned to remove Gaussian noise.

11. The magnetic resonance imaging apparatus according to claim 9, wherein
the neural network is further learned to remove at least one of aliasing artifacts, ringing artifacts, or body motion artifacts.

12. The magnetic resonance imaging apparatus according to claim 1,
wherein the data consistency maintenance unit is configured to create the estimated measurement data by replacing data on a measured position in the denoised k-space data with data on a same position in the measurement data.

13. The magnetic resonance imaging apparatus according to claim 1,
wherein the data consistency maintenance unit is configured to create the estimated measurement data by performing weighted summing on data on a measurement point in the denoised k-space data and data on the measurement point of a same position in the measurement data.

14. The magnetic resonance imaging apparatus according to claim 1, wherein the noise amount estimation unit is configured to estimate the noise amount by using a signal intensity distribution of the parallel-reconstructed image before the denoising or the parallel-reconstructed image after the subject is removed from the image.

15. The magnetic resonance imaging apparatus according to claim 1, wherein the noise amount estimation unit is configured to adjust, based on the estimated noise amount, at least one of a threshold for denoising used by the noise removal unit, a coefficient of a calculation formula for the data consistency maintenance unit to calculate the estimated measurement data, or a configuration or a weight of a neural network when the noise removal unit includes the neural network.

16. The magnetic resonance imaging apparatus according to claim 1, wherein the noise amount estimation unit is provided in the iterative reconstruction unit and is configured to repeat noise amount estimation every time the initial value is updated.

17. An image processing apparatus configured to process measurement data collected by a plurality of reception coils of a magnetic resonance imaging apparatus and to reconstruct a denoised image, the image processing apparatus comprising:
    a noise amount estimation unit configured to estimate a noise amount of a parallel-reconstructed image, the noise estimation including correction of the parallel-reconstructed image (i) by a G-factor representing a spatial distribution of a noise amplification ratio and (ii) by an R-factor as a reduction factor; and
    an iterative reconstruction unit configured to reconstruct a reconstructed image by a repeated calculation using the measurement data for each of the reception coils, wherein the iterative reconstruction unit includes:
    an initial value setting unit configured to set initial image data for the repeated calculation based on the measurement data for each of the reception coils;
    a synthesis unit configured to synthesize a synthesized image for each of the reception coils;
    a noise removal unit configured to remove noise included in the synthesized image based on statistical properties of the synthesized image and the noise and based on a parameter adjusted based on the estimated noise amount; and
    a data consistency maintenance unit configured to create denoised k-space data for each of the reception coils by using the denoised image and to create estimated measurement data by integrating the denoised k-space data and the measurement data, and
    wherein the iterative reconstruction unit is configured to perform iterative processing while updating the initial value based on the estimated measurement data.

18. An image processing method for processing measurement data collected by a plurality of reception coils of a magnetic resonance imaging apparatus and creating a denoised reconstructed image, the image processing method comprising:
    estimating a noise amount of a parallel-reconstructed image, the noise estimation including correction of the parallel-reconstructed image (i) by a G-factor representing a spatial distribution of a noise amplification ratio and (ii) by an R-factor as a reduction factor; and
    iterative processing of maintaining consistency between denoised k-space data and the measurement data, the iterative processing including:
    a step of setting initial image data for the processing based on measurement data for each of the reception coils;
    a step of synthesizing a synthesized image for each of the reception coils;
    a step of removing noise included in the synthesized image based on statistical properties of the synthesized image and the noise and based on a parameter adjusted based on the estimated noise amount; and
    a step of creating denoised k-space data for each of the reception coils by using the denoised image and creating estimated measurement data by integrating the denoised k-space data and the measurement data, and
    wherein the processing is repeated while updating the initial value based on the estimated measurement data.

\* \* \* \* \*